United States Patent
Zhang et al.

(10) Patent No.: US 9,751,750 B2
(45) Date of Patent: Sep. 5, 2017

(54) MEMS PRESSURE SENSOR WITH THERMAL COMPENSATION

(71) Applicant: Semiconductor Manufacturing International (Shanghai) Corporation, Shanghai (CN)

(72) Inventors: Xianming Zhang, Shanghai (CN); Guangcai Fu, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 14/711,766

(22) Filed: May 13, 2015

(65) Prior Publication Data

US 2016/0009546 A1  Jan. 14, 2016

(30) Foreign Application Priority Data

Jun. 3, 2014  (CN) .......................... 2014 1 0242793

(51) Int. Cl.
| | |
|---|---|
| *B81B 3/00* | (2006.01) |
| *G01L 19/04* | (2006.01) |
| *G01L 9/12* | (2006.01) |
| *G01L 9/00* | (2006.01) |

(52) U.S. Cl.
CPC ............ *B81B 3/0081* (2013.01); *G01L 9/005* (2013.01); *G01L 9/0047* (2013.01); *G01L 9/0048* (2013.01); *G01L 9/0073* (2013.01); *G01L 19/04* (2013.01); *B81B 2201/0264* (2013.01)

(58) Field of Classification Search
CPC .... B81B 2201/0264; B81B 2201/0278; B81B 3/0081; G01L 9/0042; G01L 19/04; G01L 9/0047; G01L 9/0048; G01L 9/005; G01L 9/0073
USPC .......................................................... 73/724
See application file for complete search history.

(56) References Cited

U.S. PATENT DOCUMENTS

| | | | | |
|---|---|---|---|---|
| 5,631,428 | A * | 5/1997 | Catanescu ............. | G01L 9/0042 257/419 |
| 6,012,336 | A * | 1/2000 | Eaton .................. | B81C 1/00246 73/754 |
| 6,401,544 | B2* | 6/2002 | Aigner ................ | B81C 1/00896 73/754 |
| 8,217,475 | B2* | 7/2012 | Seesink ................. | G01L 9/0073 257/419 |

(Continued)

*Primary Examiner* — Eric Ward
(74) *Attorney, Agent, or Firm* — Kilpatrick Townsend and Stockton LLP

(57) ABSTRACT

A semiconductor device having a capacitive pressure sensor structure includes a substrate, an interlayer dielectric layer on the substrate, a bottom electrode of a pressure sensor within the interlayer dielectric layer, a pressure sensing cavity above the bottom electrode, a sensing film above the pressure sensing cavity and covering a portion of the interlayer dielectric layer, a cover layer on the interlayer dielectric layer and on the sensing film, the cover layer having an opening exposing a portion of the sensing film, and a high thermal expansion coefficient material layer disposed on cover layer and sidewalls of the opening. Through the use of the high thermal expansion coefficient material layer, the capacitive pressure sensor structure is not susceptible to changes in ambient temperature to enhance the sensitivity of the capacitive pressure sensor structure.

12 Claims, 2 Drawing Sheets

(56) References Cited

U.S. PATENT DOCUMENTS

| | | | |
|---|---|---|---|
| 2013/0001550 A1* | 1/2013 | Seeger | G01L 5/223 257/48 |
| 2013/0152694 A1* | 6/2013 | Urvas | G01L 9/0073 73/724 |
| 2014/0000377 A1* | 1/2014 | Lin | B81C 1/00246 73/754 |
| 2014/0088890 A1* | 3/2014 | Hao | G01L 9/125 702/52 |
| 2015/0060956 A1* | 3/2015 | Chen | B81C 1/00246 257/254 |

* cited by examiner

MEMS PRESSURE SENSOR WITH THERMAL COMPENSATION

CROSS-REFERENCES TO RELATED APPLICATIONS

This application claims priority to Chinese patent application No. 201410242793.8, filed on Jun. 3, 2014, the content of which is incorporated herein by reference in its entirety.

BACKGROUND OF THE INVENTION

The present invention relates generally to micro-electronic mechanical systems (MEMS), and more particularly to air pressure sensors with temperature compensation.

With the continuous development of semiconductor technology, among the motion sensors available in the market, smartphones, CMOS integrated circuits and MEMS devices are the mainstream products with the most technological advance. The development of motion sensors tends towards smaller size, high quality and high performance, and high resistant to wear and tear.

MEMS pressure sensors are widely used in automotive electronics, such as tire pressure monitoring systems (TPMS), engine oil pressure sensors, car brake system air pressure sensors, automotive engine intake manifold pressure sensors (TMAP), common rail pressure sensors of diesel engines. Other MEMS pressure sensors are found in consumer electronics, such as fetal monitoring instruments (manometers), blood pressure monitors, kitchen scales, washing machines, dishwashers, refrigerators, microwave ovens, vacuum cleaners, washing machines, water dispensers, solar water heaters with level control pressure sensors; and in industrial electronics, such as digital pressure gauges, digital flow meters, industrial weighing of ingredients, and so forth.

A typical MEMS capacitive pressure sensor includes a sense capacitor Cs and a reference capacitor Cr. An ambient pressure can be measured by the capacitive difference between the sense capacitor Cs and the reference capacitor Cr. However, the structures of the sense capacitor Cs and the reference capacitor Cr differ from each other, so that the sense capacitor Cs and the reference capacitor Cr have different temperature variation characteristics that cannot be uniformly compensated for. Thus, the temperature offset between the sense capacitor Cs and the reference capacitor Cr results in measurement errors that affect the sensor reliability.

In general, a capacitive pressure sensor is susceptible to ambient temperature. The cavity of the capacitive pressure sensor is under a thermal expansion and contraction, leading to changes in the sensing capacitor Cs.

In view of the foregoing, there is a need for a novel method and apparatus for manufacturing a semiconductor device that can overcome the deficiencies of the prior art.

BRIEF SUMMARY OF THE INVENTION

Embodiments of the present invention provide a semiconductor comprising: a substrate, an interlayer dielectric layer on the substrate, a bottom electrode of a pressure sensor within the interlayer dielectric layer, a pressure sensing cavity above the bottom electrode, a sensing film above the pressure sensing cavity and covering a portion of the interlayer dielectric layer, a cover layer on the interlayer dielectric layer and on the sensing film, the cover layer having an opening exposing a portion of the sensing film, and a high thermal expansion coefficient material layer disposed on the cover layer and sidewalls of the opening.

In one embodiment, the sensing film comprises silicon or silicon germanium.

In one embodiment, the high thermal expansion coefficient material layer is disposed in a peripheral edge of the sensing film.

In one embodiment, the high thermal expansion coefficient material layer forms an annular distribution around a peripheral edge of the sensing film.

In one embodiment, the high thermal expansion coefficient material layer has a thermal expansion coefficient greater than a thermal expansion coefficient of the sensing film.

In one embodiment, the high thermal expansion coefficient material layer has a thermal expansion coefficient greater than 5.0 ppm/K.

In one embodiment, the high thermal expansion coefficient material layer comprises a metal material. The metal material comprises aluminum.

In one embodiment, the high thermal expansion coefficient material layer has a thickness smaller than a thickness of the sensing film.

Embodiments of the present invention also provides an electronic device comprising a semiconductor device having a capacitive pressure sensor structure. The semiconductor device includes a substrate, an interlayer dielectric layer on the substrate, a bottom electrode of a pressure sensor within the interlayer dielectric layer, a pressure sensing cavity above the bottom electrode, a sensing film above the pressure sensing cavity and covering a portion of the interlayer dielectric layer, a cover layer on the interlayer dielectric layer and on the sensing film, the cover layer having an opening exposing a portion of the sensing film, and a high thermal expansion coefficient material layer disposed on cover layer and sidewalls of the opening.

Through the use of the high thermal expansion coefficient material layer, the capacitive pressure sensor structure is not susceptible to changes in ambient temperature to enhance the sensitivity of the capacitive pressure sensor structure.

The following description, together with the accompanying drawings, will provide a better understanding of the nature and advantages of the claimed invention.

DETAILED DESCRIPTION OF THE INVENTION

Figure 1A:
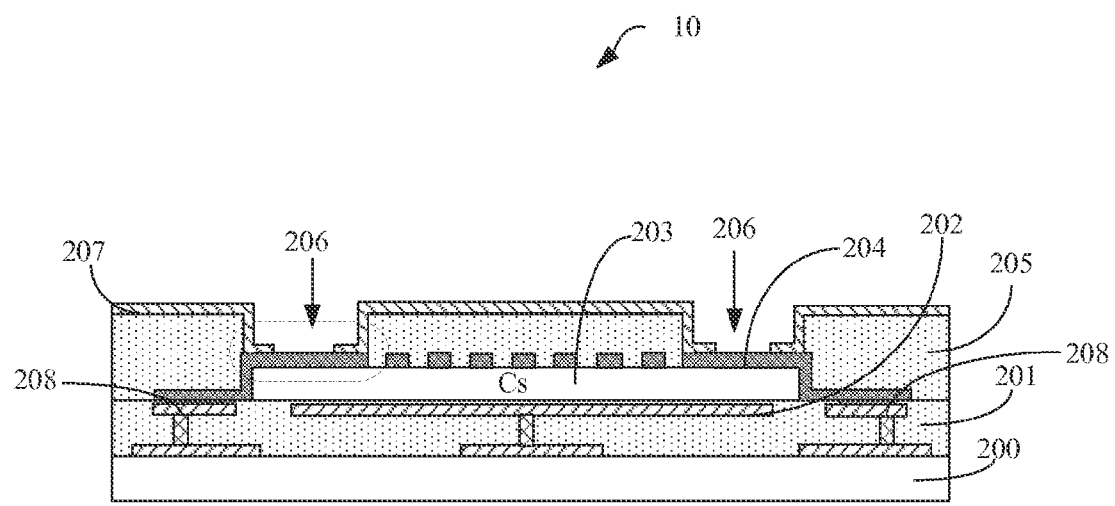
FIG. 1A is a simplified cross-sectional view of a partial sensing capacitor of a pressure capacitive sensor according to an embodiment of the present invention.

In the following description, numerous specific details are provided for a thorough understanding of the present invention. However, it should be appreciated by those of skill in the art that the present invention may be realized without one or more of these details. In other examples, features and techniques known in the art will not be described for purposes of brevity.

It should be understood that the drawings are not drawn to scale, and similar reference numbers are used for representing similar elements. Embodiments of the invention are described herein with reference to cross-section illustrations that are schematic illustrations of idealized embodiments (and intermediate structures) of the invention. The thickness of layers and regions in the drawings may be exaggerated relative to each other for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

It will be understood that, when an element or layer is referred to as "on," "disposed on," "adjacent to," "connected to," or "coupled to" another element or layer, it can be disposed directly on the other element or layer, adjacent to, connected or coupled to the other element or layer, or intervening elements or layers may also be present. In contrast, when an element is referred to as being "directly on," directly disposed on," "directly connected to," or "directly coupled to" another element or layer, there are no intervening elements or layers present between them. It will be understood that, although the terms "first," "second," "third," etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Relative terms such as "under," "below," "underneath," "over," "on," "above," "bottom," and "top" are used herein to described a relationship of one element, layer or region to another element, layer or region as illustrated in the figures. It will be understood that these terms are intended to encompass different orientations of the structure in addition to the orientation depicted in the figures. For example, if the device shown in the figures is flipped, the description of an element being "below" or "underneath" another element would then be oriented as "above" the other element. Therefore, the term "below," "under," or "underneath" can encompass both orientations of the device. Because devices or components of embodiments of the present invention can be positioned in a number of different orientations (e.g., rotated 90 degrees or at other orientations), the relative terms should be interpreted accordingly.

The use of the terms first, second, etc. do not denote any order, but rather the terms first, second, etc. are used to distinguish one element from another. Furthermore, the use of the terms a, an, etc. does not denote a limitation of quantity, but rather denote the presence of at least one of the referenced items. It will be further understood that the terms "comprising", "including", having" and variants thereof, when used in this specification, specify the presence of stated features, steps, operations, elements, and/or components, but do not preclude the presence or addition of one or more other features, steps, operations, elements, components, and/or groups thereof. Furthermore, as used herein, the words "and/or" may refer to and encompass any possible combinations of one or more of the associated listed items.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Prepositions, such as "on", "side" (as in "sidewall"), "below", "above", "higher", "lower", "over" and "under" are defined with respect to the conventional plane or surface being on the top surface of the wafer or substrate, regardless of the orientation of the wafer or substrate. It will be understood that these terms are intended to encompass different orientations of the device in addition to the orientation depicted in the figures.

Embodiment 1

Referring to FIGS. 1A to 1D, a capacitive pressure sensor structure will be explained in detail according to an embodiment of the present invention. FIGS. 1A-1D are illustrated using various shading to distinguish the different elements of the capacitive pressure sensor structure.

FIG. 1A is a cross-sectional view of a capacitive sensing structure of a partial capacitive pressure sensor 10 (alternatively referred to as "capacitive sensing structure of the pressure sensor" hereinafter) according to an embodiment of the present invention. Capacitive pressure sensor 10 is shown as including a substrate 200 having one or more CMOS devices (not shown) formed thereon.

Substrate 200 includes at least a semiconductor substrate, which may be one of silicon substrate, silicon-on-insulator (SOI), silicon-on-insulator laminate (SSOI), silicon germanium on insulator (SiGeOI), germanium on insulator (GeOI), and the like. A number of active and/or passive devices may also be formed on the semiconductor substrate, and the number of the formed active and/or passive devices depends on specific design requirements and is non-limiting.

The capacitive sensing structure of the pressure sensor 10 may include an interlayer dielectric layer 201, which is disposed on semiconductor substrate 200. Interlayer dielectric layer 201 may be an oxide or a nitride, such as $SiO_2$, fluorocarbon (CF), SiN, carbon-doped silicon oxide (SiOC), silicon carbon nitride (SiCN), or the like. Interlayer dielectric layer 201 includes $SiO_2$ in a non-limiting exemplary embodiment.

The capacitive sensing structure may include a sensing region disposed in the central portion of the pressure sensor 10 and a metal interconnect region disposed at the outer peripheral region of the sensing region.

The capacitive sensing structure of the pressure sensor may include a bottom electrode 202 disposed within interlayer dielectric layer 201, bottom electrode 202 can be made of aluminum or other metal materials depending on actual requirements.

In an exemplary embodiment, multiple metal layers may be formed below bottom electrode 202, the multiple metal layers are interconnected to each other through vias with the bottom metal layer which is connected to one or more CMOS devices disposed in substrate 200, so that bottom electrode 202 is connected to the one or more CMOS devices in substrate 200 through the multiple metal layers. In an embodiment, the metal layers may be made of aluminum, and the vias are made of tungsten (W), but are not limited thereto.

The capacitive sensing structure of the pressure sensor 10 may further include a top interconnect structure 208 disposed on the outer periphery of bottom electrode 202, top interconnect structure 208 includes a first end connected to the CMOS devices in substrate 200 and a second end connected to a sensing film (membrane) 204. In an embodiment, top interconnect structure 208 includes multiple metal layers that are connected to each other through vias. The top metal layer of top interconnect structure 208 is connected to the sensing film (membrane), and the bottom layer of top interconnect structure 208 is connected to the CMOS devices in substrate 200. In an embodiment, if the metal layers of top interconnect structure 208 are made of aluminum, the vias may be made of tungsten (W) or other metal materials.

The capacitive sensing structure of the pressure sensor 10 may further include a pressure sensing cavity 203 disposed over bottom electrode 202. Pressure sensing cavity 203 may include a dielectric layer (not shown) disposed between bottom electrode 202 and sensing film 204. Bottom electrode 202 and sensing film 204 form a variable sensing capacitor Cs to detect a pressure change in an external environment (e.g., pressure outside of capacitive pressure sensor 10). A change in capacitance of capacitor Cs as a function of a pressure change can be registered by a sensing circuit (not shown).

Sensing film 204 is disposed over pressure sensing cavity 203 and covers a portion of interlayer dielectric layer 201. Sensing film 204 changes its form when there is a change in pressure, the deflection of sensing film 204 corresponds to the amount of pressure exercised on the capacitive pressure sensor 10. The deflection of the sensing film 204 causes a change in the distance between bottom electrode 202 and sensing film 204, resulting in a change in capacitance of capacitor Cs, thereby obtaining a change in pressure.

The capacitive sensing structure of the pressure sensor 10 may further include a cover layer 205 disposed on interlayer dielectric layer 201 and on sensing film 204. Cover layer 205 covers the plurality of openings of sensing film 204. Cover layer 205 includes an opening 206 exposing a portion of sensing film 204. Cover layer 205 may includes a nitride material such as silicon nitride in an exemplary embodiment.

Figure 1B:
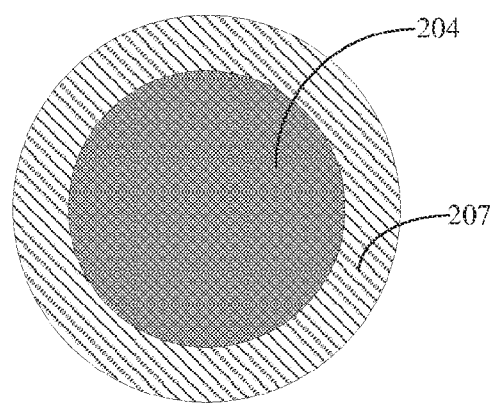
FIG. 1B is a top view of a distribution ring of a high thermal expansion material layer according to an embodiment of the present invention.

The sensitive capacitive structure of the pressure sensor may further include a layer 207 disposed on at least a portion of opening 206 of cover layer 205, layer 207 including a material with a high thermal expansion coefficient. The term "material with a thermal expansion coefficient" is defined herein as a material that can expand in a dimensional direction from an initial dimension upon changing the temperature of the material. A high thermal expansion coefficient material refers to a material that has a coefficient greater than 5 part per millions (ppm) per degree Celsius. In an embodiment, layer 207 may cover the entire upper surface of cover layer 205 and sidewalls of opening 206. In an embodiment, layer 207 is disposed at the outer peripheral of sensing film 204, such as in an annular (circular) ring, as shown in FIG. 1B. Layer 207 can have other shapes such as rectangular, square, polygonal, oval and other similar shapes depending on design requirements.

Furthermore, the thermal expansion coefficient of layer 207 must be greater than the thermal expansion coefficient of sensing film 204. In an embodiment, sensing film 204 is made of $Si_{0.4}Ge_{0.6}$, and the thermal expansion coefficient is about 4.2 to 5.0 ppm/K, layer 207 may have a material with the thermal expansion coefficient greater than 5.0 ppm/K.

In an embodiment, layer 207 may include a metal material such as aluminum having a thermal expansion coefficient of 23.1 ppm/K. Layer 207 may include other materials having a high thermal expansion coefficient such as copper, gold, magnesium, manganese, platinum, silver, titanium, zinc, tin, tungsten, and alloys thereof.

In addition, the high thermal expansion coefficient material layer 207 may have a thickness that is less than the thickness of sensing film 204. In an embodiment, the thickness of high thermal expansion coefficient material layer 207 is less than 4000 angstroms. In a specific embodiment, the thickness of high thermal expansion coefficient material layer 207 can be adjusted according to actual requirements and is not limited thereto.

Figure 1C:
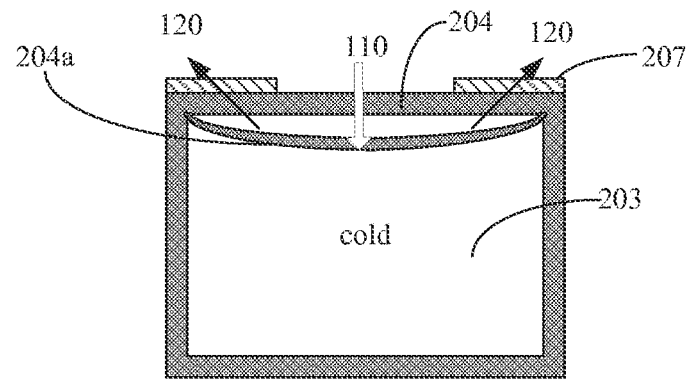
FIG. 1C is a cross-sectional view of a sensitive film of a pressure sensor in a cold stress situation according to an embodiment of the present invention.

In an embodiment, sensing film 204 may be made of SiGe and covered with a aluminum layer at its outer peripheral edge. Because the thermal expansion coefficient of aluminum is greater than that of SiGe, when the ambient temperature changes, the aluminum layer may have a suppression effect to weaken the change of the sensing capacitor Cs. As shown in FIG. 1C, when the ambient temperature is low, air inside pressure sensing cavity 203 contracts (indicated by hollow arrow 110) so that sensing film 204 deflects and takes on the form 204a. In accordance with the present invention, the sensing film has an aluminum layer disposed on its outer peripheral edge, when air inside the pressure sensing cavity contracts at low temperature (indicated by "cold"), the aluminum layer sensitive film will apply a front-side pull force (indicated by solid arrow 120) to the sensing film, thereby preventing the deflection of the sensing film.

Figure 1D:
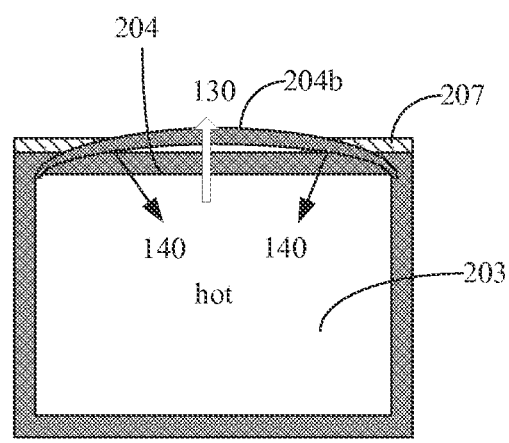
FIG. 1D is a cross-sectional view of a sensitive film of a pressure sensor in a hot stress situation according to an embodiment of the present invention.

Referring to FIG. 1D, when the ambient temperature is high (indicated by "hot"), air inside pressure sensing cavity 203 expands (indicated by hollow arrow 130) so that sensing film 204 deflects and takes on the form 204b. The presence of the aluminum layer at its outer periphery exercises pressure (indicated by solid arrow 140) to the sensing film to prevent the deflection of the sensing film and reduce the change of the sensing capacitor Cs, thereby improving the reliability of the pressure sensor.

In summary, a sensitive capacitive structure of the pressure sensor according to embodiments of the present invention may have following advantages: through coating the sensing film with a layer of a high thermal expansion coefficient material, the change of the capacitive capacitor under variations of ambient temperatures can be reduced, and at the same time the structure of the sensing capacitor does not change and will not affect the pressure sensitivity, thereby increasing the reliability and yield of the capacitive pressure sensor.

Embodiment 2

Embodiments of the present invention also provide an electronic device that includes at least the above-described capacitive pressure sensor. The capacitive pressure sensor (which is a semiconductor device) includes a substrate, an interlayer dielectric layer on the substrate, a bottom electrode of a pressure sensor disposed within the interlayer dielectric layer, a pressure sensing cavity disposed over the bottom electrode, a sensing film disposed above the pressure sensing cavity, a cover layer disposed on the interlayer dielectric layer and above the sensing film, the cover layer includes an opening exposing a portion of the sensing film, and a layer of a high thermal expansion coefficient material disposed on an outer periphery of the exposed portion of the sensing film.

Because the semiconductor device has higher reliability and yield so that the electronic device also has the same advantages.

In an embodiment, the electronic device having the above-described semiconductor device may be a laptop, a netbook, a game console, a TV, a DVD player, a GPS device, a camera, a voice recorder, MP3, MP4, PSP, a mobile phone, and other intermediate products and electronic components that include the above-described semiconductor device such as a printed circuit board of a smart phone that includes the above-described semiconductor device.

While the present invention is described herein with reference to illustrative embodiments, this description is not intended to be construed in a limiting sense. Rather, the purpose of the illustrative embodiments is to make the spirit of the present invention be better understood by those skilled in the art. In order not to obscure the scope of the invention, many details of well-known processes and manufacturing techniques are omitted. Various modifications of the illustrative embodiments as well as other embodiments will be apparent to those of skill in the art upon reference to the description.

Furthermore, some of the features of the preferred embodiments of the present invention could be used to advantage without the corresponding use of other features. As such, the foregoing description should be considered as merely illustrative of the principles of the invention, and not in limitation thereof.

What is claimed is:

1. A semiconductor device comprising:
   a substrate;
   an interlayer dielectric layer on the substrate;
   a bottom electrode of a pressure sensor within the interlayer dielectric layer;
   a pressure sensing cavity above the bottom electrode;
   a sensing film above the pressure sensing cavity and covering a portion of the interlayer dielectric layer;
   a cover layer on the interlayer dielectric layer and on the sensing film, the cover layer having an opening exposing a portion of the sensing film;
   a high thermal expansion coefficient material layer disposed on the cover layer and sidewalls of the opening while leaving a central portion of the opening uncovered so that a central portion of the exposed portion of the sensing film remains exposed, the high thermal expansion coefficient material layer having a high thermal expansion coefficient higher than a thermal expansion coefficient of the sensing film, wherein the exposed central portion is not covered by any other layer.

2. The semiconductor device of claim 1, wherein the sensing film comprises silicon or silicon germanium.

3. The semiconductor device of claim 1, wherein the high thermal expansion coefficient material layer is disposed in the vicinity of a peripheral edge of the sensing film.

4. The semiconductor device of claim 1, wherein the high thermal expansion coefficient material layer is distributed in an annular form around a peripheral edge of the sensing film.

5. The semiconductor device of claim 1, wherein the thermal expansion coefficient of the high thermal expansion coefficient material layer is greater than 5.0 ppm/K.

6. The semiconductor device of claim 1, wherein the high thermal expansion coefficient material layer comprises a metal material.

7. The semiconductor device of claim 6, wherein the metal material comprises aluminum.

8. The semiconductor device of claim 1, wherein the high thermal expansion coefficient material layer has a thickness smaller than a thickness of the sensing film.

9. The semiconductor device of claim 1, further comprising:
   a device in the substrate; and
   an interconnect structure disposed on an outer periphery of the bottom electrode and comprising a first terminal connected to the device and a second terminal opposite the first terminal and connected to the sensing film.

10. The semiconductor device of claim 9, wherein the interconnect structure comprises a plurality of metal layers connected to each other through a plurality of vias.

11. The semiconductor device of claim 10, wherein the plurality of metal layers are made of aluminum, and the plurality of vias are made of tungsten.

12. An electronic device comprising a semiconductor device, the semiconductor device comprising:
   a substrate;
   an interlayer dielectric layer on the substrate;
   a bottom electrode of a pressure sensor within the interlayer dielectric layer;
   a pressure sensing cavity above the bottom electrode;
   a sensing film above the pressure sensing cavity and covering a portion of the interlayer dielectric layer;
   a cover layer on the interlayer dielectric layer and on the sensing film, the cover layer having an opening exposing a portion of the sensing film;
   a high thermal expansion coefficient material layer disposed on the cover layer and sidewalls of the opening while leaving a central portion of the opening uncovered so that a central portion of the exposed portion of the sensing film remains exposed, the high thermal expansion coefficient material layer having a high thermal expansion coefficient higher than a thermal expansion coefficient of the sensing film, wherein the exposed central portion is not covered by any other layer.

* * * * *